United States Patent
Lee et al.

(10) Patent No.: US 7,981,711 B2
(45) Date of Patent: Jul. 19, 2011

(54) MANUFACTURE METHOD OF A MULTILAYER STRUCTURE HAVING NON-POLAR A-PLANE {11-20} III-NITRIDE LAYER

(75) Inventors: Wei-I Lee, Hsinchu (TW); Jenn-Fang Chen, Hsinchu (TW); Chen-Hao Chiang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 72 days.

(21) Appl. No.: 12/468,138

(22) Filed: May 19, 2009

(65) Prior Publication Data

US 2010/0193843 A1      Aug. 5, 2010

(30) Foreign Application Priority Data

Feb. 4, 2009    (TW) .............................. 98103464 A

(51) Int. Cl.
*H01L 21/00*     (2006.01)
*H01L 31/06*     (2006.01)
*H01L 21/20*     (2006.01)
*H01L 21/36*     (2006.01)

(52) U.S. Cl. .... 438/46; 438/507; 257/201; 257/E21.121

(58) Field of Classification Search ............... 438/46, 438/507, 47; 257/E21.108, E21.112, E21.121, 257/E21.127, 615, 201
See application file for complete search history.

(56) References Cited

U.S. PATENT DOCUMENTS

| | | | |
|---|---|---|---|
| 2005/0239271 A1* | 10/2005 | Sakakibara et al. | 438/483 |
| 2008/0026502 A1* | 1/2008 | Imer et al. | 438/46 |
| 2008/0163814 A1* | 7/2008 | Kim et al. | 117/95 |
| 2009/0081857 A1* | 3/2009 | Hanser et al. | 438/507 |
| 2009/0086783 A1* | 4/2009 | Kameyama et al. | 372/49.01 |
| 2009/0283028 A1* | 11/2009 | Schowalter et al. | 117/9 |
| 2010/0012849 A1* | 1/2010 | Miko et al. | 250/372 |
| 2010/0150193 A1* | 6/2010 | Bhat et al. | 372/44.01 |

* cited by examiner

*Primary Examiner* — Walter L Lindsay, Jr.
(74) *Attorney, Agent, or Firm* — Peter F. Corless; Steven M. Jensen; Edwards Angell Palmer & Dodge LLP

(57) ABSTRACT

A manufacture method of a multilayer structure having a non-polar a-plane {11-22} III-nitride layer includes forming a nucleation layer on a r-plane substrate, wherein the nucleation layer is composed of multiple nitride layers; and forming a non-polar a-plane {11-20} III-nitride layer on the nucleation layer. The nucleation layer features reduced stress, reduced phase difference of lattice, blocked elongation of dislocation, and reduced density of dislocation. Thus, the non-polar a-plane {11-20} III-nitride layer with flat surface can be formed.

17 Claims, 6 Drawing Sheets

MANUFACTURE METHOD OF A MULTILAYER STRUCTURE HAVING NON-POLAR A-PLANE {11-20} III-NITRIDE LAYER

FIELD OF THE INVENTION

The present invention relates to a multilayer stricture having a III-nitride layer and a manufacture method of the same, and more particularly, to a multilayer structure having a non-polar III-nitride layer with flat surface and high crystal quality and a manufacture method of the same.

BACKGROUND OF THE INVENTION

Light emitting diodes (LED) have hitherto been developed for several decades, red, green and yellow light emitting diodes have been successfully developed and have reached the level of commercialization. Blue/green light emitting diodes with ultra-high brightness have been recently investigated in institutions all over the world. III-nitride semiconductor light emitting materials show themselves beyond many semiconductor light emitting materials of green-ultraviolet band since they are advantaged in direct energy gap, strong chemical bonds and high beat conductivity. Nitrides, including aluminum nitride (AlN), gallium nitride (GaN), indium nitride (InN) and the like, can be used for emitting light almost over the range of visual light and even extending to ultraviolet field. Thus, the nitrides have been recently used in various high-tech products such as elements capable of emitting light over the range from blue/green light to ultraviolet light, high power and high temperature electrical elements, large-sized fully-colored electrical signboards, traffic lights, backlight sources of liquid crystal display, special emitting light sources, semiconductor laser reading head of digital video discs (DVD) and the like.

Now, commercialized blue/green light emitting diodes in use are mainly made of III-nitrides and V-nitrides but the photoelectric effect is insufficient due to the polarity caused by epitaxial direction and structure of the materials. Generally, when polar c-plane III-nitride is employed, a built-in electric field occurs in moving direction of carriers due to asymmetric atomic charges to further generate quantum confined stark effect (QCSE) which deflects quantum trap energy gap structure to reduce overlap odds of electron wave function and hole wave function and further to cause decrease of light emitting efficiency and red shift of the spectrum. In addition to increase of photoelectric effect to enhance light emitting efficiency of an element non-polar III-nitrides and V-nitrides also facilitate application of the light emitting element since the light emitted by the non-polar material has the performance of polarized light. Generally, non-poly GaN is formed on a sapphire ($Al_2O_3$) substrate and then an LED or a laser diode is manufactured.

FIG. 1A and FIG. 1B show a manufacture method of a general non-polar a-plane {11-20} GaN. Referring to FIG. 1A, a r-plane {11-102} sapphire substrate (10) is placed in a metal organic chemical vapor deposition (MOCVD) device and annealed at high temperature, then a low-temperature aluminum indium nitride (AlInN) layer (11) is formed at 400-900° C. As shown in FIG. 1B, non-polar a-plane {11-20} GaN (12) is formed on the AlInN layer (11) by MOCVD process, wherein V/III ratio of the gallium source is about 770-2,310, and epitaxial pressure of the nitrogen source is about 0.5 atm (or higher) and epitaxial temperature is 1100° C.

However, difference between lattice constants of layers causes lattice mismatch to form dislocation during formation of the layers, thus, general manufacture method of non-polar a-plane {11-20} GaN cannot effectively reduce dislocation density which risks generation of holes on surface of the GaN to further cause problems of the GaN surface such as roughness or cracking.

Thus, in order to overcome the problems above-mentioned, it is desired to reduce dislocation density generated during forming GaN on a sapphire substrate, thereby forming GaN with flat surface and high crystal quality.

SUMMARY OF THE INVENTION

Thus, the present invention provides a manufacture method of a multilayer structure having a non-polar III-nitride layer, which comprises: providing a substrate; forming a plurality of nucleation layers; and forming a non-polar III-nitride layer on the nucleation layers, wherein each of the nucleation layers is independently made of nitride having formula (I) shown below:

$$A_xB_{1-x}N \qquad (I)$$

in which A and B are different elements selected from B, Al, Ga, In and Tl, and $0 \leq x \leq 1$.

According to the manufacture method of a multilayer structure above-mentioned, the substrate may be an r-plane substrate and the III-nitride layer may be a non-polar a-plane {11-20} III-nitride layer. In an embodiment, examples of the substrate include sapphire, GaN, zinc oxide and silicon carbide.

In an embodiment, formation of a plurality of nucleation layers comprises the steps of forming a first nucleation layer at 1000-1200° C. and a second nucleation layer at 700-900° C. on the substrate in sequence, and the first and second nucleation layers are made of AlN. In another embodiment, the formation may also comprise forming a third nucleation layer at 1000-1200° C. after formation of the second nucleation layer, and the third nucleation layer is made of AlN.

In a further embodiment, the manufacture method may also comprise forming an aluminum gallium nitride layer after forming the nucleation layers to sandwich the aluminum gallium nitride layer in between the nucleation layers and the non-polar III-nitride layer. The aluminum gallium nitride has formula (I):

$$A_xB_{1-x}N \qquad (I)$$

wherein A is Al, B is Ga, and $0.1 \leq x \leq 0.9$.

The manufacture method further comprises annealing the r-plane substrate before forming the nucleation layers.

Regarding the manufacture method of a multilayer structure of the present invention, the nucleation layers are high-temperature nitride layers formed at 1000-1200° C. or low-temperature nitride layers formed at 700-900° C.

Regarding the manufacture method of a multilayer structure of the present invention, the nucleation layers formed on the substrate are a high-temperature nitride layer, a low-temperature nitride layer, and a high-temperature nitride layer formed in sequence. An aluminum gallium nitride layer may be further formed between the nucleation layers and the non-polar III-nitride layer. During the formation of the aluminum gallium nitride layer, gallium can be gradually increased with the thickness of the aluminum gallium nitride layer formed, but aluminum can be gradually decreased as the thickness of the aluminum gallium nitride layer formed increases.

According to the manufacture method above-mentioned, the nucleation layers are formed at a pressure of 50-150 torr with epitaxial V/III ratio at 1000-1800.

Also according to the manufacture method above-mentioned, the non-polar III-nitride layer may be non-polar a-plane {11-20} GaN.

According to the manufacture method of a multilayer structure above-mentioned, the non-polar III-nitride layer is formed at 1000-1200° C. at a pressure of 50-150 torr with epitaxial V/III ratio at 700-1600.

Also according to the manufacture method of a multilayer structure above-mentioned, the nucleation layers may be formed by metal organic vapor epitaxy or hydride vapor deposition, and the non-polar a-plane {11-20} III-nitride layer may be formed by metal organic vapor epitaxy or hydride vapor deposition.

The present invention further provides a multilayer structure having a non-polar III-nitride, which includes a substrate, a plurality of nucleation layers formed on the substrate, and a non-polar III-nitride layer formed on the nucleation layers to sandwich the nucleation layers in between the substrate and the non-polar III-nitride layer wherein each of the nucleation layers is independently made of nitride having formula (I):

$$A_xB_{1-x}N \quad (I)$$

in which A and B are different elements selected from B, Al, Ga, In and Tl, and $0 \leq x \leq 1$.

Regarding the above-mentioned structure, the nucleation layers include a first nucleation layer and a second nucleation layer formed at 1000-1200° C. and 700-900° C., respectively, on the substrate in sequence, and the first and second nucleation layers are made of AlN. In another embodiment, the non-polar multilayer structure having a III-nitride layer may further include a third nucleation layer formed at 1000-1200° C. to sandwich the second nucleation layer in between the first nucleation layer and the third nucleation layer, and the third nucleation layer is made of AlN, i.e., the nucleation layers can be high-temperature nitride layers formed at 1000-1200° C., or low-temperature nitride layers formed at 700-900° C., or high-temperature nitride layer/low-temperature nitride layer/high-temperature nitride layer.

Moreover, the non-polar multilayer structure having a III-nitride layer may also include an aluminum gallium nitride layer sandwiched in between the nucleation layers and the non-polar III-nitride layer, and the aluminum gallium nitride has formula (I):

$$A_xB_{1-x}N \quad (I)$$

wherein A is Al, B is Ga, and $0.1 \leq x \leq 0.9$. During the formation of the aluminum gallium nitride layer, gallium can be gradually increased with the thickness of the aluminum gallium nitride layer formed, but aluminum can be gradually decreased as the thickness of the aluminum gallium nitride layer formed increases.

The manufacture method of a multilayer structure having a III-nitride layer of the present invention is performed by forming nucleation layers composed of a plurality of high-temperature or low-temperature nitride layers, and forming a III-nitride layer. The nucleation layers can effectively reduce stress, reduce lattice mismatch, block dislocation extending and reduce dislocation density, which facilitates formation of a III-nitride layer with flat surface and high crystal quality and without requirement for considerable thickness, therefore, time and cost for production are reduced. The nucleation layers also facilitate formation of a III-nitride layer with high quality at epitaxial conditions of high temperature, low pressure and low V/III ratio. Furthermore, the manufacture method of the present invention is simple.

DETAILED DESCRIPTION OF THE INVENTION

The following illustrative embodiments are provided to illustrate the disclosure of the present invention, these and other advantages and effects can be apparently understood by persons skilled in the art after reading the disclosure of this specification.

Example 1

FIG. 2A through FIG. 2D show the manufacture method of a multilayer structure having a non-polar III-nitride layer according to Example 1 of the present invention.

Figure 1A:
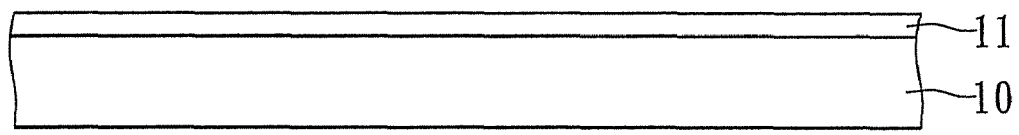
FIG. 1A and FIG. 1B (PRIOR ART) show a conventional manufacture method of non-polar a-plane {11-20} GaN.
Figure 1B:
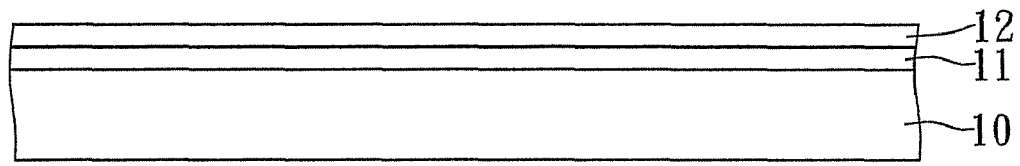
Figure 2A:
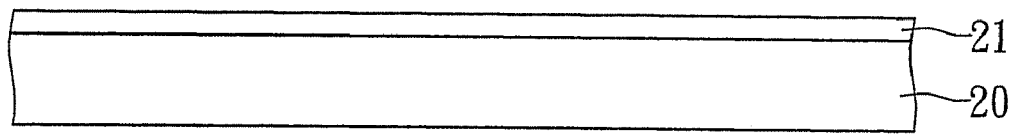
FIG. 2A through FIG. 2D show a manufacture method of a multilayer structure having a non-polar III-nitride layer according to Example 1 of the present invention.

Referring to FIG. 2A, an r-plane substrate (20) is provided and may be annealed before a plurality of nucleation layers are formed, wherein each of the nucleation layers is made of nitride having formula (I):

$$A_xB_{1-x}N \quad (I)$$

in which A and B are different elements selected from B, Al, Ga, In and Tl, and $0 \leq x \leq 1$.

In this example, a first nucleation layer (21) is formed at high temperature such as 1000-1200° C. on a substrate (20) which may be r-plane sapphire, GaN, zinc oxide (ZnO) or silicon carbide, and the first nucleation layer (21) can be made of aluminum nitride (AlN). The first nitride layer (21) can be formed by metal organic vapor epitaxy or hydride vapor deposition, for example, the first nucleation layer (21) is formed at 50-150 torr, preferably at 100 torr, with epitaxial V/III ratio regulated at a low level such as 1000-1800.

Figure 2B:
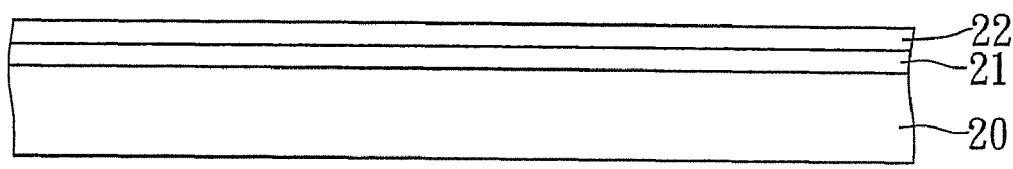

Referring to FIG. 2B, a second nucleation layer (22) is formed on the high-temperature nucleation layer (21) at low temperature such as 700-900° C., the second nucleation layer (22) may be made of AlN and can be formed by metal organic vapor epitaxy or hydride vapor deposition. Similarly, the second nucleation layer (22) can be formed at low pressure such as 50-150 torr, preferably at 100 torr, with epitaxial V/III ratio regulated at a low level such as 1000-1800.

Figure 2C:
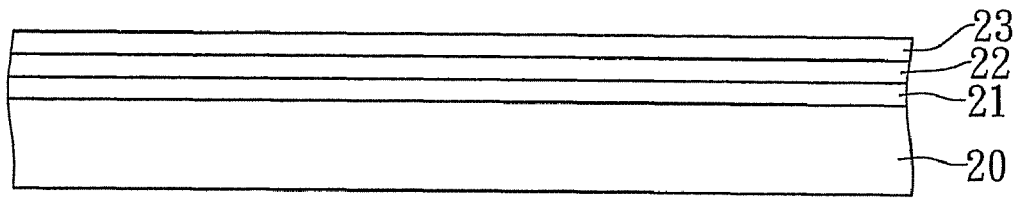

Referring to FIG. 2C, a third nucleation layer (23) is farmed on the low-temperature nitride layer (22) at high temperature such as 1000-1200° C., the third nucleation layer (23) may be made of AlN, GaN or aluminum gallium nitride (AlGaN) and can be formed by metal organic vapor epitaxy or hydride vapor deposition. Similarly, the third nucleation layer (23) can be formed at low pressure such as 50-150 torr, preferably at 100 torr, with epitaxial V/III ratio regulated at a low level such as 1000-1800. Furthermore, the total thickness or the first nucleation layer (21), the second nucleation layer (22) and the third nucleation layer (23) is about 100-120 nm.

Figure 2D:
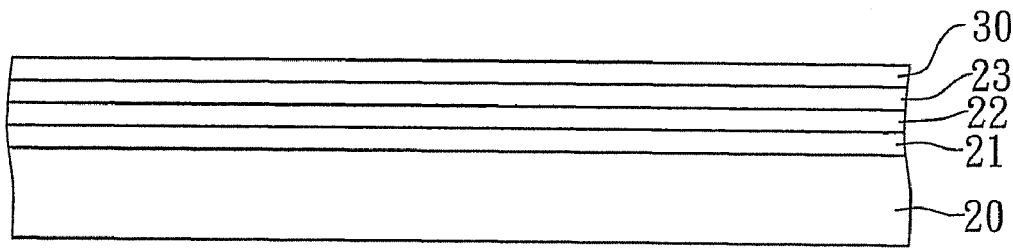

Although a non-polar a-plane {11-20} IIIA-nitride layer (30) can be formed on the second nucleation layer, in this example, the non-polar a-plane {11-20} IIIA-nitride layer (30) is formed on the third nucleation layer (23) to sandwich the nucleation layers in between the substrate (20) and the non-polar a-plane {11-20} III-nitride layer (30), as shown in FIG. 2D. The non-polar a-plane {11-20} III-nitride layer (30) may be a non-polar a-plane {11-20} GaN layer and can be formed by metal organic vapor epitaxy or hydride vapor deposition at pressure such as 50-150 torr, preferably at 100 torr, at High temperature of 1000-1200° C. with epitaxial V/III ratio regulated at a low level such as 700-1600, preferably at 729-1216. In an embodiment, a non-polar a-plane {11-20} III-nitride layer with excellent surface flatness and without holes is obtained at epitaxial V/III ratio of 912.

Example 2

Figure 3:
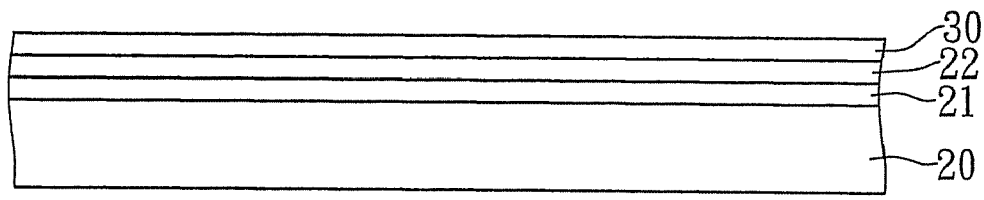
FIG. 3 is a cross-sectional view of the multilayer structure having a non-polar III-nitride layer in Example 1 of the present invention.

Referring to FIG. 3, a first nucleation layer (21), a second nucleation layer (22) and a non-polar a-plane {11-20} III-nitride layer (30) are formed on the r-plane substrate (20) in sequence according to the procedure of Example 1.

Example 3

Figure 4:
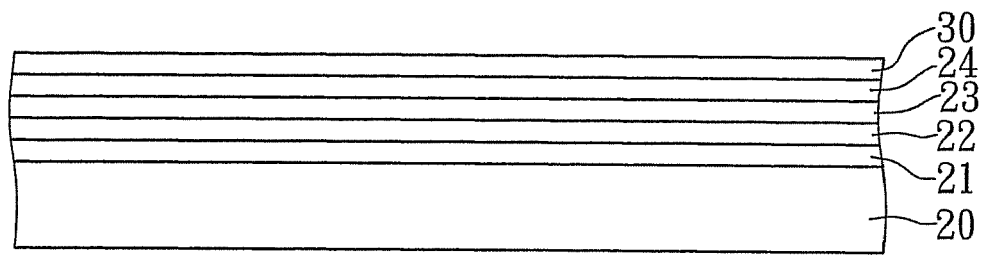
FIG. 4 is a cross-sectional view of the multilayer structure having a non-polar III-nitride layer in Example 3 of the present invention.

Referring to FIG. 4, a first nucleation layer (21), a second nucleation layer (22), a third nucleation layer (23), a fourth nucleation layer (24) formed at such as 700-900° C. and a non-polar a-plane {11-20} III-nitride layer (30) are formed on the r-plane substrate (20) in sequence according to the procedure of Example 1.

Example 4

Figure 5:
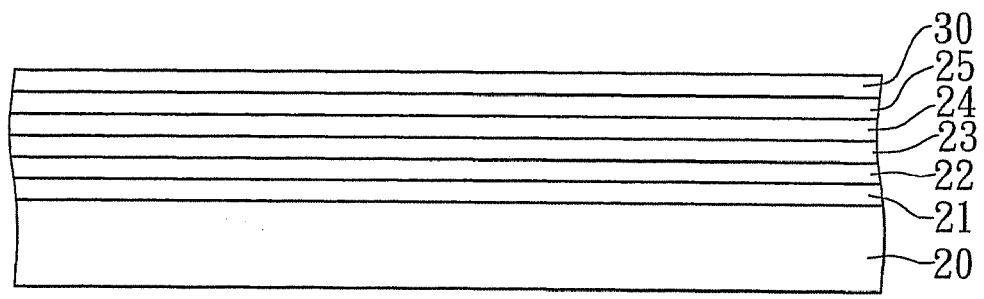
FIG. 5 is a cross-sectional view of the multilayer structure having a non-polar III-nitride layer in Example 4 of the present invention.

Referring to FIG. 5, a first nucleation layer (21), a second nucleation layer (22), a third nucleation layer (23), a fourth nucleation layer (24) formed at 700-900° C., a fifth nucleation layer (25) formed at 1000-1200° C., and a non-polar a-plane {11-20} III-nitride layer (30) are formed on the r-plane substrate (20) in sequence according to the procedure of Example 1.

Example 5

Figure 6:
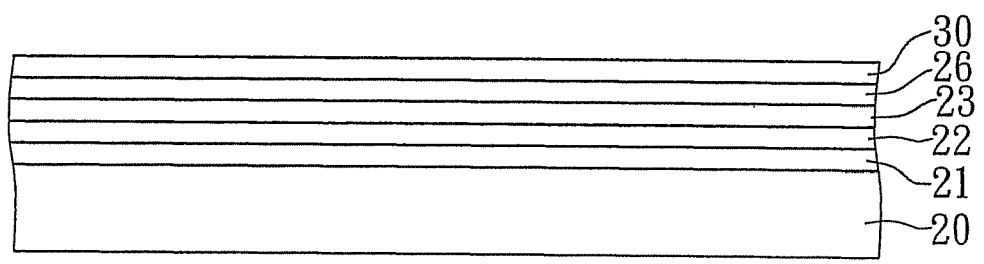
FIG. 6 is a cross-sectional view of the multilayer structure having a non-polar III-nitride layer in Example 5 of the present invention.

Referring to FIG. 6, a first nucleation layer (21), a second nucleation layer (22), a third nucleation layer (23), an AlGaN layer (26) and a non-polar a-plane {11-20} III-nitride layer (30) are formed on the r-plane substrate (20) in sequence according to the procedure of Example 1, wherein the AlGaN layer (26) has different aluminum/gallium ratio, specifically, the AlGaN has formula (I):

$$A_xB_{1-x}N \quad (I)$$

in the formula, A is Al, B is Ga, and $0.1 \leq x \leq 0.9$. During the formation of the AlGaN layer (26), gallium can be gradually increased as the thickness of the AlGaN layer (26) formed increases, but aluminum can be gradually decreased as the thickness of the AlGaN layer (26) formed increases. For example, $Al_xGa_{1-x}N$, in which X changes from 0.9 to 0.1. Formation of the AlGaN layer (26) can also reduce lattice mismatch between an upper layer and a lower layer. However, it should be understood that FIG. 6 is an example provided to illustrate formation of the AlGaN layer (26), so that the AlGaN layer can also be formed between the nucleation layers and the non-polar III-nitride layer in an embodiment having two, four or five nucleation layers.

Figure 7B:
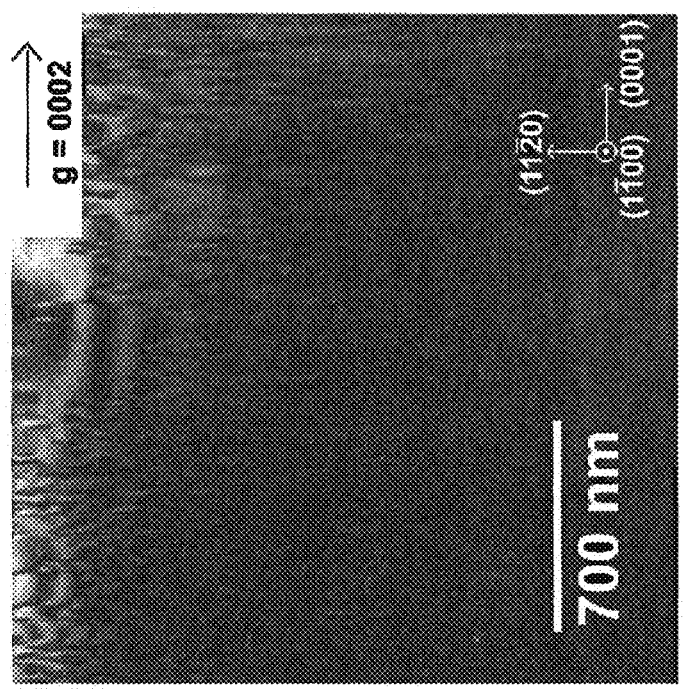
FIG. 7B (PRIOR ART) shows a transmission electron microscopic image of a cross-section of a known non-polar III-nitride layer.
Figure 7A:
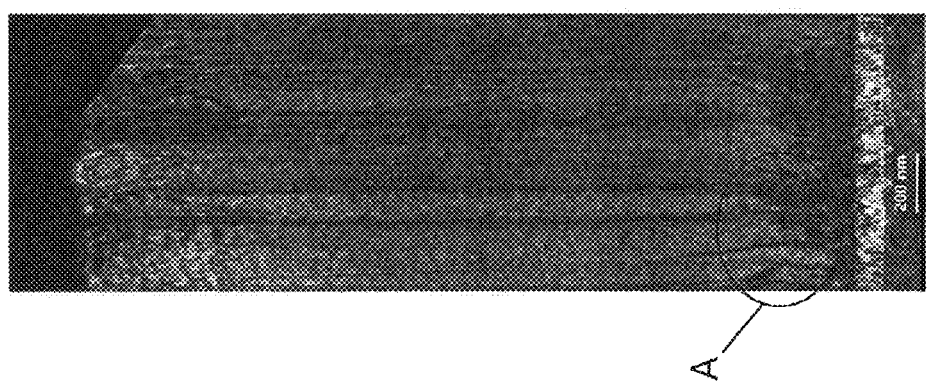
FIG. 7A shows a transmission electron microscopic image of a cross-section of the multilayer structure having a non-polar III-nitride layer in Example 1 of the present invention.

FIG. 7A and FIG. 7B are transmission electron microscopic (TEM) images of a cross-section of a multilayer structure having a non-polar a-plane {11-20} III-nitride layer. As indicated by the mark A in FIG. 7A, bending of dislocation of GaN, the top layer in the multilayer structure of the present invention, is observed when comparing the multilayer structure having three AlN layers of Example 1 as shown in FIG. 7A to a multilayer structure having one AlN layer as shown in FIG. 7B, thereby dislocation density of surface is reduced. Actually, a dislocation (pore) number is calculated to be about $4.76 \times 10^{10}/cm^2$ on per unit area of a known structure, while the dislocation number of the present invention is only about $1.6 \times 10^9/cm^2$ which is decreased by more than ten times.

Figures 8A, 8B, 8C:
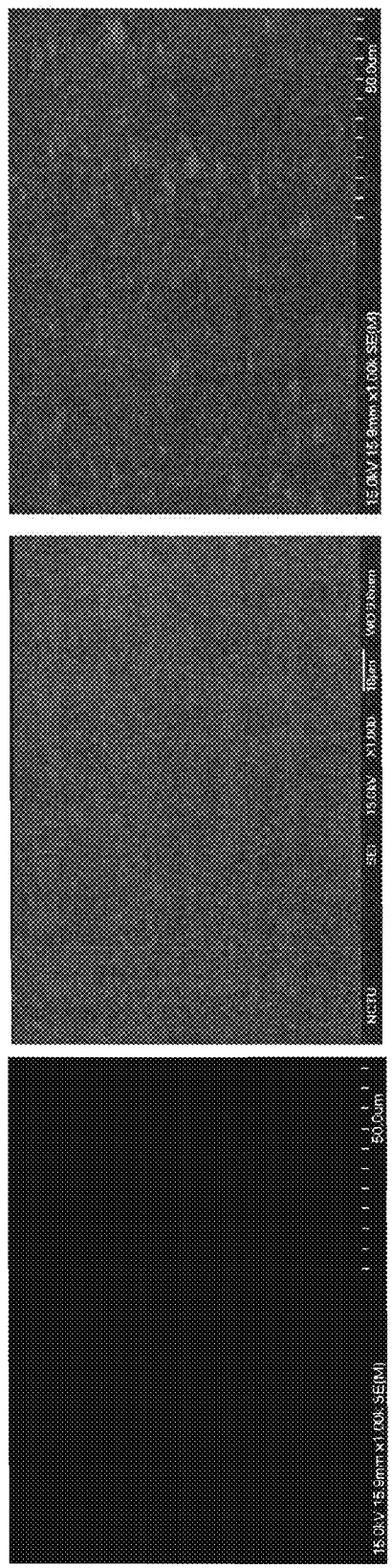
FIG. 8A through FIG. 8C show scanning electron microscopic images of surface of the non-polar III-nitride layer of the present invention.

FIG. 8A through FIG. 8C are scamming electron microscopic images of a surface of the non-polar a-plane {11-20} III-nitride layer of the present invention. V/III ratio of the top GaN layer is regulated at 1216 in FIG. 8A, at 912 in FIG. 8B, and at 729 in FIG. 8C, the surface of the top GaN layer with V/III ratio of 912 (shown in FIG. 8B) is the flattest one, but generally, flatness of surface of the top layer with V/III ratio of 900-1300 is sufficient.

Figure 9:
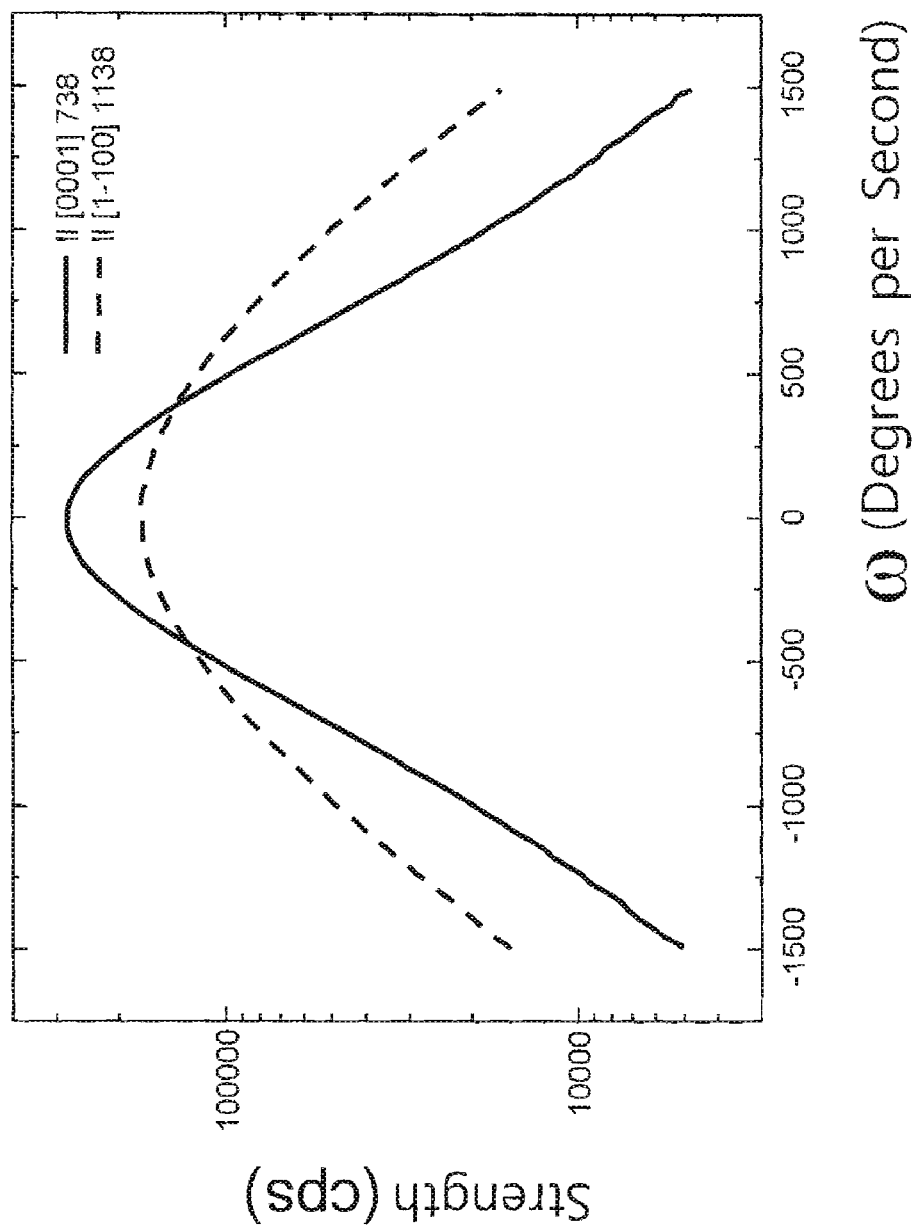
FIG. 9 is XRD spectrum of the multilayer structure having a non-polar III-nitride layer in Example 1 of the present invention.

As shown in FIG. 9 which is XRD (X-ray diffraction) spectrum of the multilayer structure having a non-polar a-plane {11-20} III-nitride layer in Example 1 of the present invention, the multilayer structure having three AlN layers of the present invention facilitates crystal quality (the XRD full width at half maximum (FWHM) is 738 in c direction and is 1138 in direction) of the a-plane {11-20} GaN. Generally, epitaxial quality is better, if the FWHM decreases as the thickness increases during epitaxy. It is well known that the epitaxial quality is improved by increasing the thickness in a general process. For example, XRD FWHM is about 738 in c direction and is 1138 in m direction as aforementioned when epitaxial thickness is up to 20-30 μm, however, high epitaxial quality is observed in the present invention when thickness of the non-polar a-plane {11-20} III-nitride layer is 2-10 μm, e.g., thickness of the non-polar a-plane {11-20} III-nitride layer in Example 1 is 2 μm, thus production cost and time are reduced.

In an embodiment, a multilayer structure having a III-nitride layer of the present invention includes: a substrate which may be an r-plane substrate; a plurality of nucleation layers formed on the substrate, which include a first nucleation layer formed at 1000-1200° C. and a second nucleation layer formed at 700-900° C. on the substrate in sequence, wherein the first and second nucleation layers are made of AlN; a third nucleation layer made of AlN and formed at 1000-1200° C. to sandwich the second nucleation layer in between the first and third nucleation layers; and an AlGaN layer sandwiched in between the nucleation layers and the non-polar III-nitride layer and has formula (I):

$$A_xB_{1-x}N \tag{I}$$

wherein A is Al, B is Ga, and $0.1 \leq x \leq 0.9$. In an embodiment, x is 0.5 and the III-nitride layer may be a non-polar a-plane {11-20} III-nitride layer (30).

Also according to the manufacture method of the present invention, the nucleation layers (21, 22, 23, 24, 25 and 26) can be formed at low pressure such as 50-150 torr with epitaxial V/III ratio at 1000-1800.

Similarly, the non-polar III-nitride layer may be non-polar a-plane {11-20} GaN and can be formed at high temperature (1000-1200° C.) at 50-150 torr with epitaxial V/III ratio at 700-1600.

Examples of the substrate used in the multilayer structure include sapphire, GaN, ZnO and silicon carbide.

As described earlier, the manufacture method of a multilayer structure having a III-nitride layer of the present invention comprises forming a plurality of nucleation layers (preferably forming the layers at high temperature and low temperature alternately); and forming a non-polar a-plane {11-20} III-nitride layer. The nucleation layers can reduce stress, reduce lattice mismatch, block dislocation extending and reduce dislocation density to facilitate formation of a non-polar a-plane {11-20} III-nitride layer with flat surface and high epitaxial quality and without requirement for high thickness, which results in reduced production time and cost. The nucleation layers also can enhance epitaxy process at high temperature, low pressure and low V/III ratio to form an a-plane {11-20} III-nitride layer. The manufacture method is simpler than conventional ones.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

The invention claimed is:

1. A manufacture method of a multilayer structure having a non-polar III-nitride layer, comprising the steps of:
    providing a substrate;
    forming a plurality of nucleation layers on the substrate; and
    forming a non-polar III-nitride layer on the nucleation layers, wherein each of the nucleation layers is independently made of nitride having formula (I) shown below:

$$A_xB_{1-x}N \tag{I}$$

in which A and B are different elements selected from B, Al, Ga, In and Tl, and $0 \leq x \leq 1$, wherein the formation of the nucleation layers comprises the steps of forming a first nucleation layer at 1000-1200° C. and a second nucleation layer at 700-900° C. on the substrate in sequence, the first and second nucleation layers being made of aluminum nitride.

2. The manufacture method of a multilayer structure having a non-polar III-nitride layer of claim 1, further comprising forming a third nucleation layer at 1000-1200° C. after formation of the second nucleation layer, the third nucleation layer being made of aluminum nitride.

3. The manufacture method of a multilayer structure having a non-polar III-nitride layer of claim 1, wherein the substrate is an r-plane substrate, and the non-polar III-nitride layer is a non-polar a-plane {11-20} III-nitride layer.

4. The manufacture method of a multilayer structure having a non-polar III-nitride layer of claim 1, further comprising forming an aluminum gallium nitride layer after formation of the nucleation layers to sandwich the aluminum gallium nitride layer in between the nucleation layers and the non-polar III-nitride layer, the aluminum gallium nitride having formula (I):

$$A_xB_{1-x}N \tag{I}$$

wherein A is Al, B is Ga, and $0.1 \leq x \leq 0.9$.

5. The manufacture method of a multilayer structure having a non-polar III-nitride layer of claim 1, wherein the nucleation layers are formed at a pressure of 50-150 torr.

6. The manufacture method of a multilayer structure having a non-polar III-nitride layer of claim 5, wherein epitaxial V/III ratio of the nucleation layers is 1000-1800.

7. The manufacture method of a multilayer structure having a non-polar III-nitride layer of claim 1, wherein the non-polar III-nitride layer is non-polar a-plane {11-20} gallium nitride.

8. The manufacture method of a multilayer structure having a non-polar III-nitride layer of claim 1, wherein the non-polar III-nitride layer is formed at 1000-1200° C.

9. The manufacture method of a multilayer structure having a non-polar III-nitride layer of claim 8, wherein the non-polar III-nitride layer is formed at a pressure of 50-150 torr.

10. The manufacture method of a multilayer structure having a non-polar III-nitride layer of claim 9, wherein epitaxial V/III ratio of the nucleation layers is 700-1600.

11. The manufacture method of a multilayer structure having a non-polar III-nitride layer of claim 1, wherein the substrate is sapphire, gallium nitride, zinc oxide or silicon carbide.

12. A multilayer structure having a non-polar III-nitride layer, comprising:
    a substrate;
    a plurality of nucleation layers formed on the substrate; and
    a non-polar III-nitride layer formed on the nucleation layers so as to sandwich the nucleation layers in between the substrate and the non-polar III-nitride layer, wherein each of the nucleation layers is independently made of nitride having formula (I) shown below:

$$A_xB_{1-x}N \tag{I}$$

in which A and B are different elements selected from B, Al, Ga, In and Tl, and $0 \leq x \leq 1$, wherein the nucleation layers comprise a first nucleation layer formed at 1000-1200° C. and a second nucleation layer formed at 700-900° C. on the substrate in sequence, the first and second nucleation layers being made of aluminum nitride.

13. The multilayer structure having a non-polar III-nitride layer of claim 12, further comprising a third nucleation layer formed at 1000-1200° C. and made of aluminum nitride so as to sandwich the second nucleation layer in between the first nucleation layer and the third nucleation layer.

14. The multilayer structure having a non-polar III-nitride layer of claim 12, wherein the substrate is an r-plane sub strate, and the III-nitride layer is a non-polar a-plane {11-20} III-nitride layer.

15. The multilayer structure having a non-polar III-nitride layer of claim 12, further comprising an aluminum gallium nitride layer sandwiched in between the nucleation layers and the non-polar III-nitride layer, the aluminum gallium nitride having formula (I):

$$A_xB_{1-x}N \tag{I}$$

wherein A is Al, B is Ga, and $0.1 \leqq x \leqq 0.9$.

16. The multilayer structure having a non-polar III-nitride layer of claim 12, wherein the non-polar III-nitride layer is non-polar a-plane {11-20} gallium nitride.

17. The multilayer structure having a non-polar III-nitride layer of claim 12, wherein the substrate is sapphire, gallium nitride, zinc oxide or silicon carbide.

* * * * *